US012211800B2

(12) United States Patent
Tang et al.

(10) Patent No.: US 12,211,800 B2
(45) Date of Patent: Jan. 28, 2025

(54) SEMICONDUCTOR PACKAGE WITH SHUNT AND PATTERNED METAL TRACE

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US); Liang Wan, Chengdu (CN); Makarand Ramkrishna Kulkarni, Dallas, TX (US); Jie Chen, Plano, TX (US); Steven Alfred Kummerl, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 523 days.

(21) Appl. No.: 17/500,086

(22) Filed: Oct. 13, 2021

(65) Prior Publication Data

US 2022/0384353 A1    Dec. 1, 2022

Related U.S. Application Data

(63) Continuation of application No. PCT/CN2021/097333, filed on May 31, 2021.

(30) Foreign Application Priority Data

May 31, 2021    (WO) ................ PCT/CN2021/097333

(51) Int. Cl.
*H01L 21/48* (2006.01)
*H01L 23/00* (2006.01)
*H01L 23/538* (2006.01)

(52) U.S. Cl.
CPC ...... *H01L 23/5389* (2013.01); *H01L 21/4853* (2013.01); *H01L 21/4857* (2013.01); *H01L 23/5383* (2013.01); *H01L 23/5386* (2013.01); *H01L 24/19* (2013.01); *H01L 24/20* (2013.01); *H01L 2224/214* (2013.01)

(58) Field of Classification Search
CPC ............. H01L 23/5389; H01L 23/5383; H01L 23/5386; H01L 24/19; H01L 24/20; H01L 2224/214
See application file for complete search history.

(56) References Cited

U.S. PATENT DOCUMENTS

2017/0228529 A1* 8/2017 Huang ................ H01L 23/3114

* cited by examiner

*Primary Examiner* — Samuel A Gebremariam
(74) *Attorney, Agent, or Firm* — Xiaotun Qiu; Frank D. Cimino

(57) ABSTRACT

A semiconductor package includes a first layer including a semiconductor die and a shunt embedded within a first dielectric substrate layer, and metal pillars extending therethrough. The semiconductor package further includes a second layer stacked on the first layer, the second layer including a metal trace patterned on the first dielectric substrate layer, and a second dielectric substrate layer over the metal trace. The metal trace electrically connects a first portion of the shunt to a first metal pillar of the metal pillars and electrically connects a second portion of the shunt to a second metal pillar of the metal pillars. The semiconductor package further includes a base layer opposite the second layer relative the first layer, the base layer forming exposed electrical contact pads for the semiconductor package, the electrical contact pads providing electrical connections to the shunt, the metal pillars, and the semiconductor die.

16 Claims, 8 Drawing Sheets

SEMICONDUCTOR PACKAGE WITH SHUNT AND PATTERNED METAL TRACE

TECHNICAL FIELD

This disclosure relates to semiconductor packages.

BACKGROUND

Electronic package technology continues trends towards miniaturization, integration, and speed. Semiconductor packages provide support for an integrated circuit chip or semiconductor die and associated bond wires, provide protection from the environment, and enable surface-mounting of the die to and interconnection with an external component, such as a printed circuit board (PCB). Leadframe semiconductor packages are well known and widely used in the electronics industry to house, mount, and interconnect a variety of semiconductor packages, such as integrated circuits (ICs).

A conventional leadframe is typically die-stamped from a sheet of flat stock metal and includes a plurality of metal leads temporarily held together in a planar arrangement about a central region during package manufacture by siderails forming a rectangular frame. A mounting pad for a semiconductor die is supported in the central region by "tie-bars" that attach to the frame. The leads extend from a first end integral with the frame to an opposite second end adjacent to, but spaced apart from, the die pad.

During manufacture, semiconductor dies are typically mounted on die pads of leadframes and are wire-bonded, clipped, or otherwise coupled to leads of the leadframe. Other devices may similarly be mounted on a leadframe pad. The entire assembly is later encapsulated in a mold compound, such as epoxy, to protect the assembly from potentially damaging heat, physical trauma, and other deleterious factors. The finished, molded assembly is called a semiconductor package or, more simply, a package.

BRIEF SUMMARY

Packages disclosed herein include a base layer including electrical contact pads, an embedded semiconductor die, a shunt, and metal pillars over the base layer and a metal trace patterned over the shunt and die electrically connecting the shunt and die to the electrical contact pads via the metal pillars. The base layer may include a second metal trace providing conductive paths between the metal pillars and shunt and the electrical contact pads. In some examples, such packages may combine a shunt and amplifier for current sensing. The disclosed examples may improve package reliability compared to prior designs by reducing or eliminating wire bond and/or solder connections between the shunt and electrical contact pads and/or by replacement of a stamped leadframe with the second metal trace in the base layer.

In one example, a semiconductor package includes a first layer including a semiconductor die and a shunt embedded within a first dielectric substrate layer, and metal pillars extending through the first dielectric substrate layer. The semiconductor package further includes a second layer stacked on the first layer, the second layer including a metal trace patterned on the first dielectric substrate layer, and a second dielectric substrate layer over the metal trace. The metal trace electrically connects a first portion of the shunt to a first metal pillar of the metal pillars and electrically connects a second portion of the shunt to a second metal pillar of the metal pillars. The semiconductor package further includes a base layer opposite the second layer relative the first layer, the base layer forming exposed electrical contact pads for the semiconductor package, the electrical contact pads providing electrical connections to the shunt, the metal pillars, and the semiconductor die.

In another example, a method of forming a package includes grinding a first dielectric substrate layer that covers a semiconductor die, a shunt, and metal pillars to expose distal ends of the metal pillars adjacent a surface of the first dielectric substrate layer, patterning a metal trace over the first dielectric substrate layer to electrically connect a first portion of the shunt to a first metal pillar of the metal pillars, and to electrically connect a second portion of the shunt to a second metal pillar of the metal pillars, applying a second dielectric substrate layer over the metal trace and the first dielectric substrate layer, and forming a base layer on the first dielectric substrate layer opposite the second dielectric substrate layer relative the first layer, the base layer forming exposed electrical contact pads for the semiconductor package, the electrical contact pads providing electrical connections to the shunt, the metal pillars, and the semiconductor die.

DETAILED DESCRIPTION

Various package manufacturing flaws can impact performance and cause finished packages to fail inspection. For example, when devices such as dies and other devices are coupled to leadframes, viscous materials—particularly solder—are often used to establish the connection. The solder, however, can undesirably flow into certain areas of the package or leadframe, resulting in functional or cosmetic defects.

As another example, stamped leadframe substrates may be imprecisely planar, which can affect connections to package components with planar surfaces, such as semiconductor dies and shunts. Moreover, such leadframes are generally interference fit with a package molding die, which may result in residual stresses within finished packages which can contribute to solder cracks during reliability testing and operation of the packages.

The techniques disclosed herein, including with respect to semiconductor package 100, may improve package reliability compared to prior designs by reducing or eliminating wire bond and solder connections between the die, the shunt, and the electrical contact pads and/or by replacement of a stamped leadframe with a metal trace.

Figure 1A:
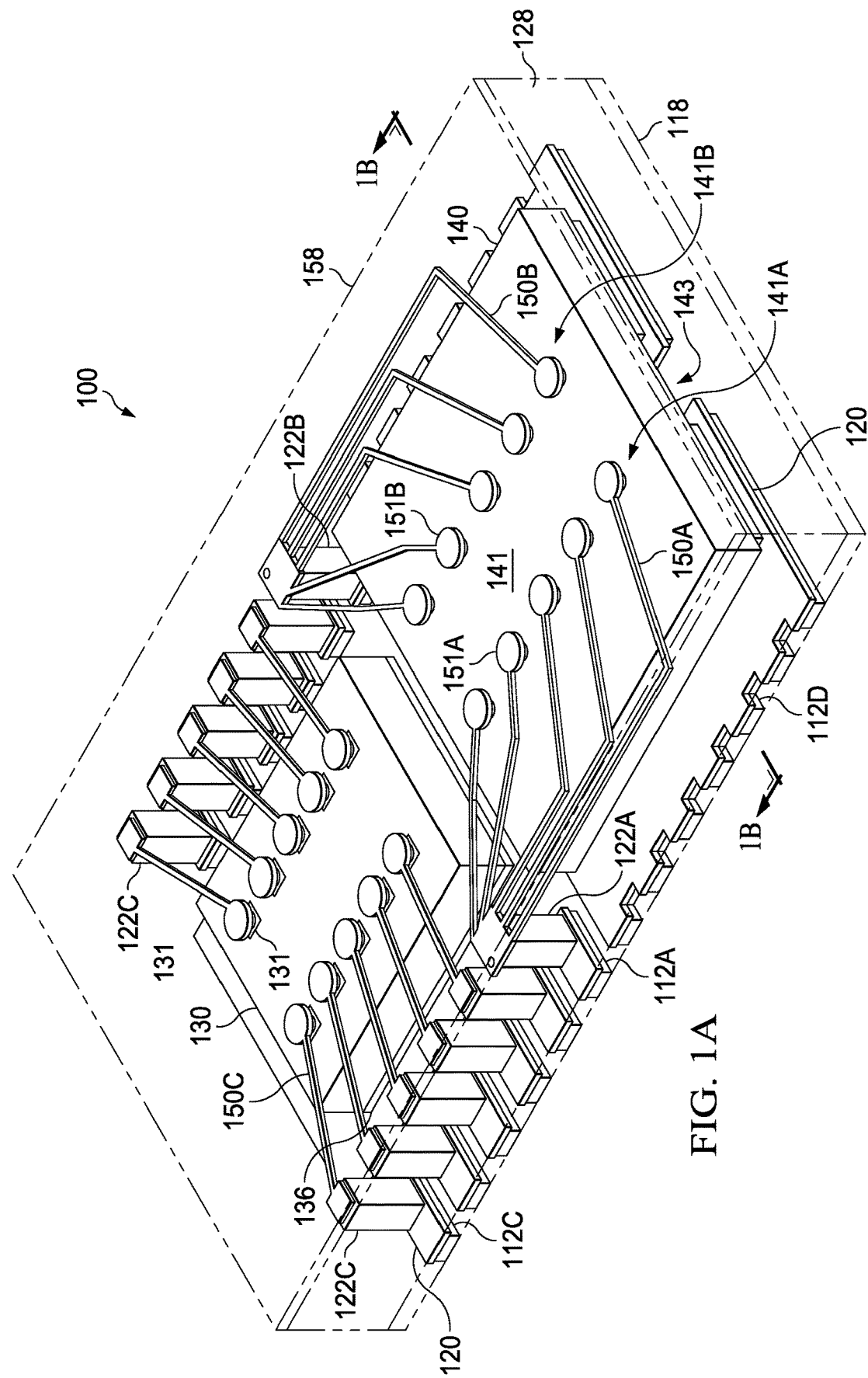
FIGS. 1A and 1B illustrate a multilayer package with a base layer including electrical contact pads, an embedded semiconductor die, a shunt and metal pillars over the base layer, and a metal trace pattered over the shunt and die electrically connecting the shunt and die to the electrical contact pads via the metal pillars.
Figure 1B:
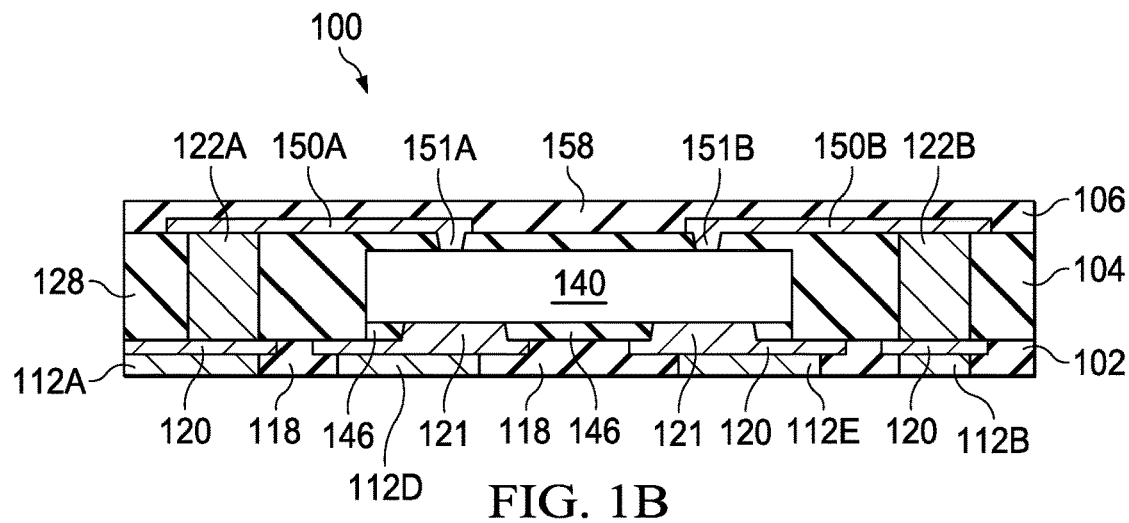

FIGS. 1A and 1B illustrate semiconductor package 100. Specifically, FIG. 1A illustrates a perspective view of semiconductor package 100, and FIG. 1B illustrates a cross-sectional view of semiconductor package 100. Semiconductor package 100 includes a first layer 104 with a semiconductor die 130 and a shunt 140 embedded in a dielectric substrate layer 128, and a second layer 106 stacked on first layer 104. Second layer 106 includes metal trace sections 150A-150C, representing a first metal trace 150, patterned on first dielectric substrate layer 128, and a second dielectric substrate layer 158 over first metal trace 150.

Semiconductor package 100 also includes a base layer 102 opposite second layer 106 relative first layer 104. Base layer 102 includes a second metal trace 120 patterned on first dielectric substrate layer 128. Second metal trace 120 is opposite first metal trace 150 relative to semiconductor die 130 and shunt 140. Base layer 102 further includes a third dielectric substrate layer 118 over second metal trace 120. Second metal trace 120 electrically connects electrical contact pads 112A-112E (collectively, "pads 112") to shunt 140, metal pillars 122A-122C (collectively, "pillars 122"), and semiconductor die 130. Base layer 102 forms exposed electrical contact pads 112. Electrical contact pads 112 provide electrical connections to shunt 140 and semiconductor die 130 via metal traces 120, 150 and metal pillars 122.

Metal traces 120, 150 are metal plating layers patterned on opposing sides of dielectric substrate layer 128. Both of metal traces 120, 150 are generally planar with the addition of vias that extend through dielectric substrate layer 128 to form electrical connections with various elements of package 100. Metal pillars 122 extend through dielectric substrate layer 128 to provide electrical connections between metal traces 120, 150. Metal pillars, as referred to herein, may also be referred to as metal bridges in they provide electrical connections that bridge between the distinct conductive layers (metal traces 120, 150) of semiconductor package 100.

Metal trace 150 includes a first section 150A that electrically connects a first portion 141A of surface 141 of shunt 140 to metal pillar 122A, and a second section 150B that electrically connects a second portion 141B of surface 141 to a second metal pillar 122B. In some examples, metal trace sections 150A, 150B may be used for current sensing of a load current through shunt 140.

Semiconductor die 130 includes bond pads 131 providing electrical connections to its functional circuitry. Bond pads 131 are electrically coupled to metal trace 150 patterned on dielectric substrate layer 128. Specifically, dielectric substrate layer 128 forms vias 151C, which are filled with the conductive material of metal trace section 150C over the bond pads, electrically connecting the functional circuitry of semiconductor die 130 to metal trace 150. Similarly, dielectric substrate layer 128 forms vias 151A, 151B over first and second portions 141A, 141B of surface 141 of shunt 140. Vias 151A, 151B are filled with the conductive material of metal trace sections 150A, 150B respectively, electrically connecting portions 141A, 141B of surface 141 of shunt 140 to metal trace 150. Metal trace section 150C connects each bond pad 131 to one of metal pillars 122C, and to one of electrical contact pads 112C via sections of metal trace 120.

Metal pillars 122 and metal traces 120, 150 may include any suitable pure metal or alloy such as, but not limited to, copper, copper alloys, gold, gold alloys or other metals. Electrical contact pads 112 may include a solderable metal and/a corrosion-resistant metal plated over a base metal layer of metal traces 120.

An inactive surface of semiconductor die 130 is bonded to metal trace 120. A dielectric film 136 separates inactive surface of semiconductor die 130 from metal trace 120. Semiconductor die 130 comprises a substrate (e.g., silicon or silicon/germanium) having an active surface and an inactive surface. Bond pads 131 are exposed in bond pad openings in a dielectric layer of semiconductor die 130 on its active surface. Bond pads 131 are bonded to a metallization layer including functional circuitry (not shown) in a semiconductor substrate. The functional circuitry of semiconductor die 130 is formed on a semiconductor wafer prior to singulation of semiconductor die 130 and includes circuit elements such as transistors, diodes, capacitors, and resistors, as well as signal lines and other electrical conductors that interconnect the various circuit elements. As nonlimiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Shunt 140 is physically and electrically connected to metal trace 120. In the specific example of semiconductor package 100, a thin dielectric film 146 separates shunt from metal trace 120; however, dielectric film 146 includes vias 121 adjacent surface 143 of shunt 140, which are filled with the conductive material of metal trace 120, electrically connecting metal trace 120 to shunt 140.

As best seen in FIG. 1B, the load current path through package 100 includes, in order, a first electrical contact pad 112D, a first section of metal trace 120, shunt 140, a second section of metal trace 120, and a second electrical contact pad 112E. Electrical contact pads 112A and 112B facilitate current sensing by way of their electrical connections to surface 141 of shunt 140. For example, current sensing may include measuring a voltage drop between portions 141A, 141B of surface 141 of shunt 140 via electrical contact pads 112A and 112B.

The electrical connection between electrical contact pad 112A and portion 141A of surface 141 includes, in order, a section of metal trace 120, metal pillar 122A, and metal trace section 150A. Likewise, the electrical connection between electrical contact pad 112B and portion 141B of surface 141 includes, in order, a section of metal trace 120, metal pillar 122B, and metal trace section 150B. In this manner, metal pillars 122 and metal traces 120, 150 provide routable three-dimensional electrical connections between semiconductor die 130, shunt 140 and electrical contact pads 112 of semiconductor package 100.

Each of metal trace sections 150A, 150B includes five connections to surface 141 shunt 140, providing significant redundancy which improves accuracy of sensed current in case of any defects in the load current path through package 100. In other examples, metal trace sections 150A, 150B may each provide more or less than five connections to surface 141 shunt 140.

Dielectric substrate layers 118, 128, 158 provide protective layers covering electronics of semiconductor package 100, including semiconductor die 130, shunt 140, and metal pillars 122. Dielectric substrate layers 118, 128, 158 may be formed from a nonconductive plastic or resin material. One or more of dielectric substrate layers 118, 128, 158 may be molded components. Mold compounds suitable for use as dielectric substrate layers 118, 128, 158 include, for example, thermoset compounds that include an epoxy novolac resin or similar material combined with a filler, such as alumina, and other materials to make the compound suitable for molding, such as accelerators, curing agents, filters, and mold release agents.

FIGS. 2A-2H illustrate conceptual process steps for manufacturing semiconductor package 100. FIG. 3 is flowchart of a method of manufacturing a multilayer package with an embedded semiconductor die additional package layers including passive components. For clarity, the techniques of FIG. 3 are described with respect to semiconductor package 100 and FIGS. 2A-2H; however, the described techniques may also be readily adapted to alternative package configurations, including packages 300, 400, as described with respect to FIGS. 4-5B.

Figure 2A:
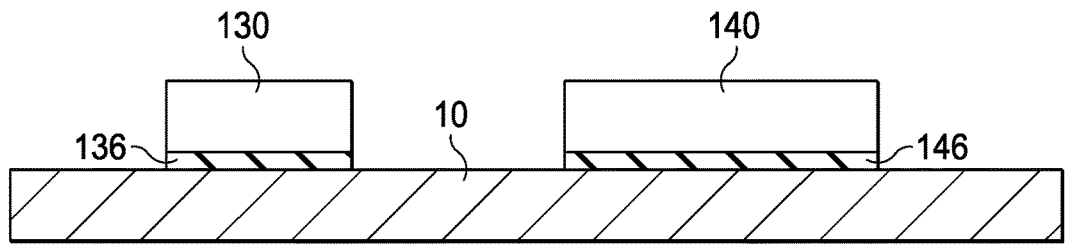
FIGS. 2A-2H illustrate conceptual process steps for manufacturing the package of FIGS. 1A and 1B.
Figure 3:
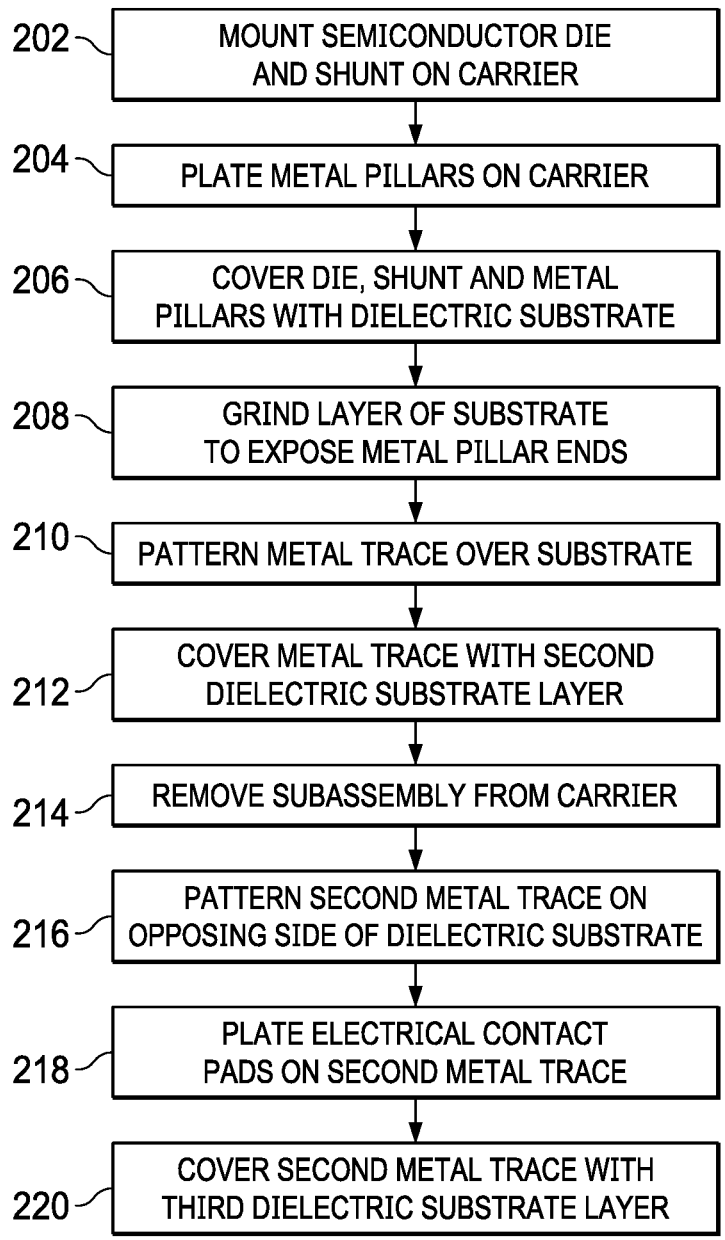
FIG. 3 is a flowchart of a method of manufacturing a multilayer package with an embedded semiconductor die and shunt, such as the package of FIGS. 1A and 1B.

As represented by FIG. 2A, semiconductor die 130 and shunt 140 are mounted on a carrier 10, such as a metal carrier or glass carrier (FIG. 3, step 202). Carrier 10 provides support for unfinished layers of semiconductor package 100 during manufacturing. Adhesives, such as thermal or UV-sensitive adhesives, are used to hold semiconductor die 130 and shunt 140 to carrier 10. In this example, dielectric film 136 secures inactive surface of semiconductor die 130 to carrier 10 and dielectric film 146 secures shunt 140 to carrier 10.

Figure 2B:
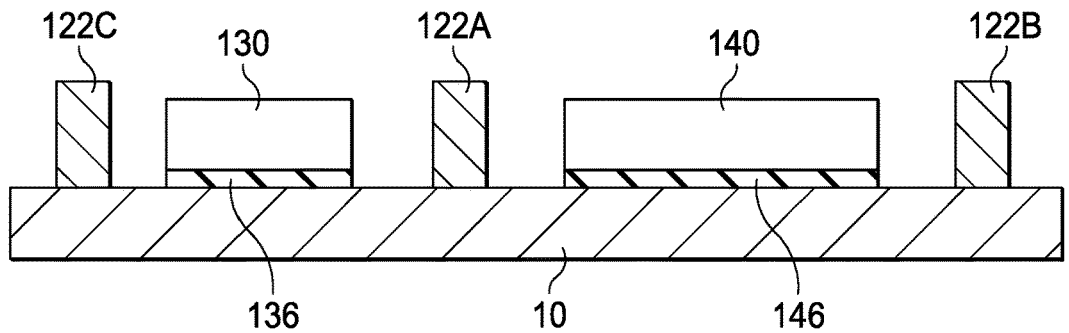

As represented by FIG. 2B, metal pillars 122 are patterned on carrier 10 to a height extending beyond semiconductor die 130 and shunt 140 (FIG. 3, step 204). In some examples, patterning metal pillars 122 may include plating multiple layers of metal carrier to build-up metal pillars 122 to the desired height.

Figure 2C:
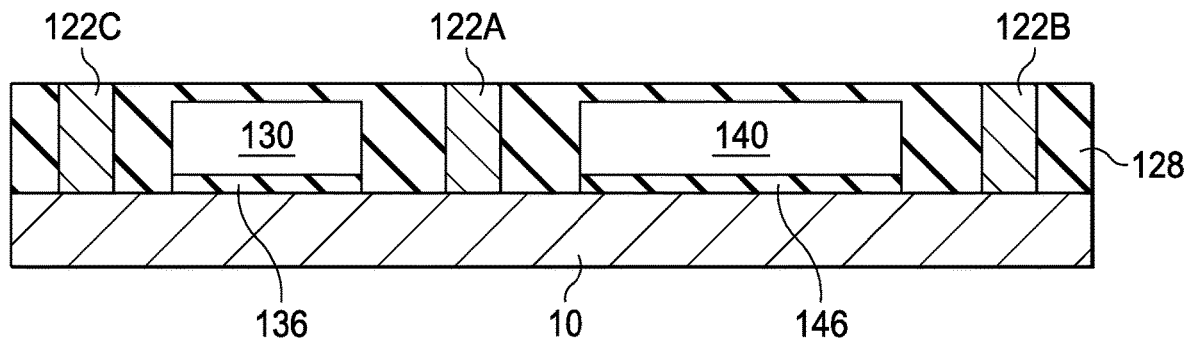

As represented by FIG. 2C, the partially assembled device of FIG. 2B is molded, thereby covering semiconductor die 130, shunt 140, and metal pillars 122 with a dielectric substrate layer 128 (FIG. 3, step 206). Dielectric substrate layer 128 may encapsulate the components of first layer 104, although distal ends of metal pillars 122 may remain exposed following molding. After molding, the process includes grinding a layer of dielectric substrate layer 128 to expose distal ends of metal pillars 122 adjacent a surface of dielectric substrate layer 128 (FIG. 3, step 208). Grinding also provide a flat surface for dielectric substrate layer 128 in a common plane with the exposed distal ends of metal pillars 122.

Figure 2D:
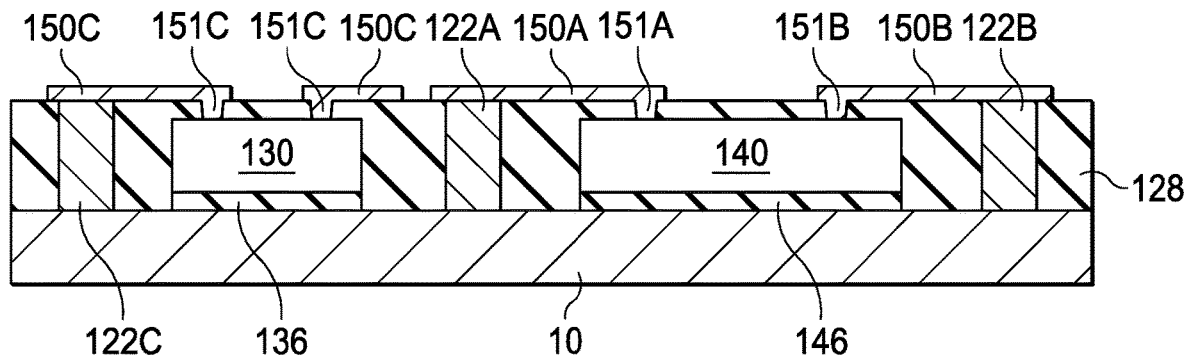

As represented by FIG. 2D, metal trace 150 is patterned over dielectric substrate layer 128 with metal pillars 122 electrically connected to metal trace 150 (FIG. 3, step 210). Vias 151A, 151B are drilled, chemically etched, or plasma-etched into dielectric substrate layer 128 to expose portions 141A, 141B of surface 141 of shunt 140 prior to plating metal trace 150. Likewise, vias 151C are drilled, chemically etched, or plasma-etched into dielectric substrate layer 128 to expose the bond pads on the active side of semiconductor die 130 prior to plating metal trace 150. Drilling may include laser drilling. While laser drilling forms round depressions in dielectric substrate layer 128, drilling is repeated to form any desired shape, such as trenches 351A, 351B, as described with respect to package 300. The plating layer of metal trace 150 fills vias 151A, 151B, 151C, electrically connecting portions 141A, 141B of surface 141 of shunt 140 and the functional circuitry of semiconductor die 130 to metal trace 150.

Figure 2E:
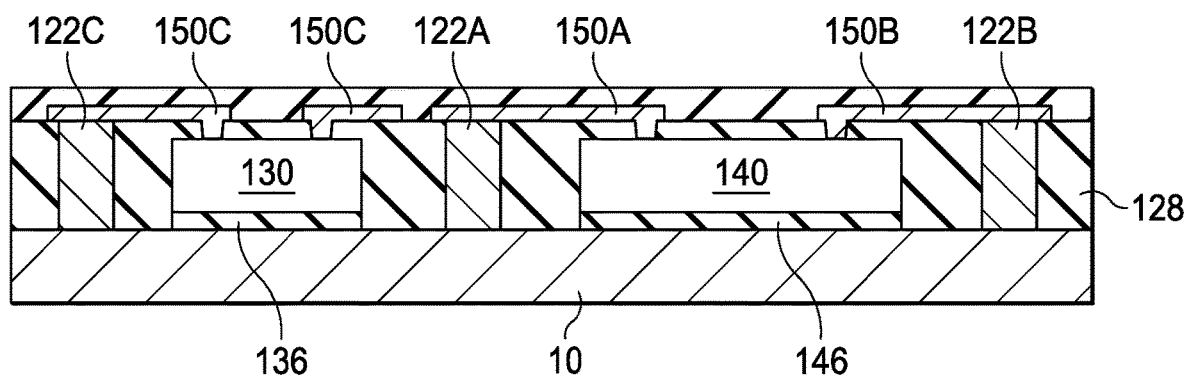

As represented by FIG. 2E, the partially assembled device is molded, thereby covering metal trace 150 with a dielectric substrate layer 158 (FIG. 3, step 212).

Figure 2F:
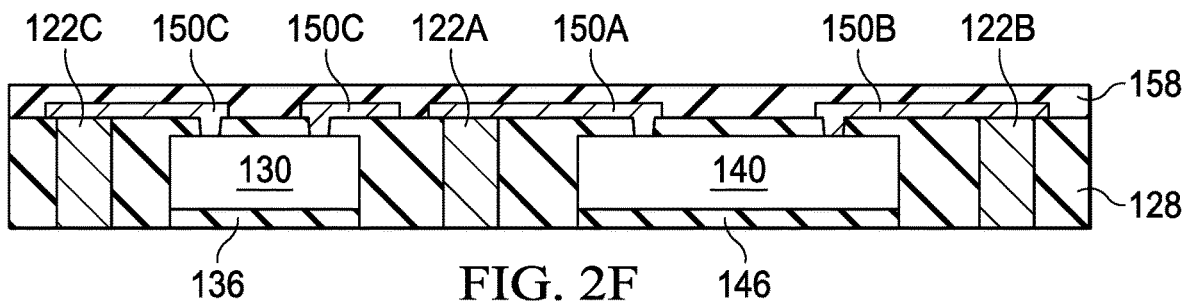

As represented by FIG. 2F, after applying dielectric substrate layer 158 over metal trace 150 and dielectric substrate layer 128, a subassembly including semiconductor die 130, shunt 140, metal pillars 122, dielectric substrate layer 128, and metal trace 150 is removed from carrier 10 (FIG. 3, step 214). Removing the partially assembled semiconductor package 100 from carrier 10 may include deactivating any adhesive securing semiconductor package 100 to carrier 10, including dielectric films 136, 146, such as by applying UV light or heat.

Figure 2G:
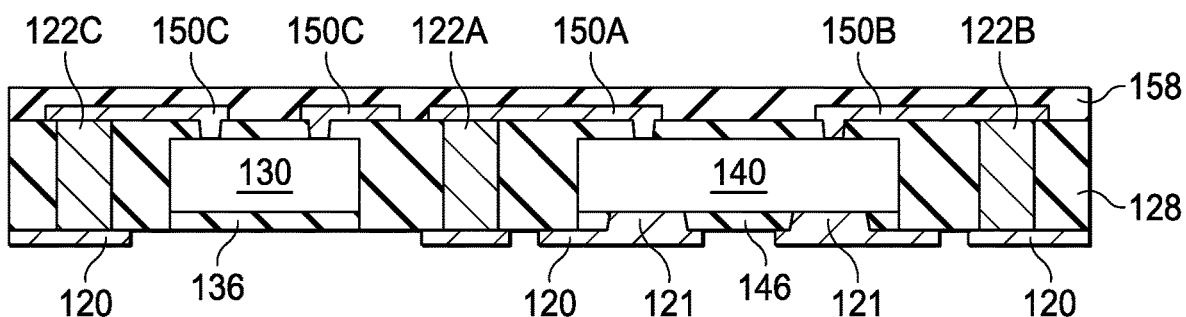

As represented by FIG. 2G, metal trace 120 is patterned over dielectric substrate layer 128 with metal pillars 122 electrically connected to metal trace 120 (FIG. 3, step 216). Vias 121 are drilled, chemically etched, or plasma-etched into dielectric film 146 to expose portions of shunt 140 prior to plating metal trace 120. The plating layer of metal trace 120 fills vias 121 electrically connecting shunt 140 to metal trace 120. While dielectric substrate layer 128 provides a planar surface conforming to carrier 10, grinding may occur prior to patterning metal trace 120 to ensure the planarity of dielectric substrate layer 128 and/or to expose distal ends of metal pillars 122.

Figure 2H:
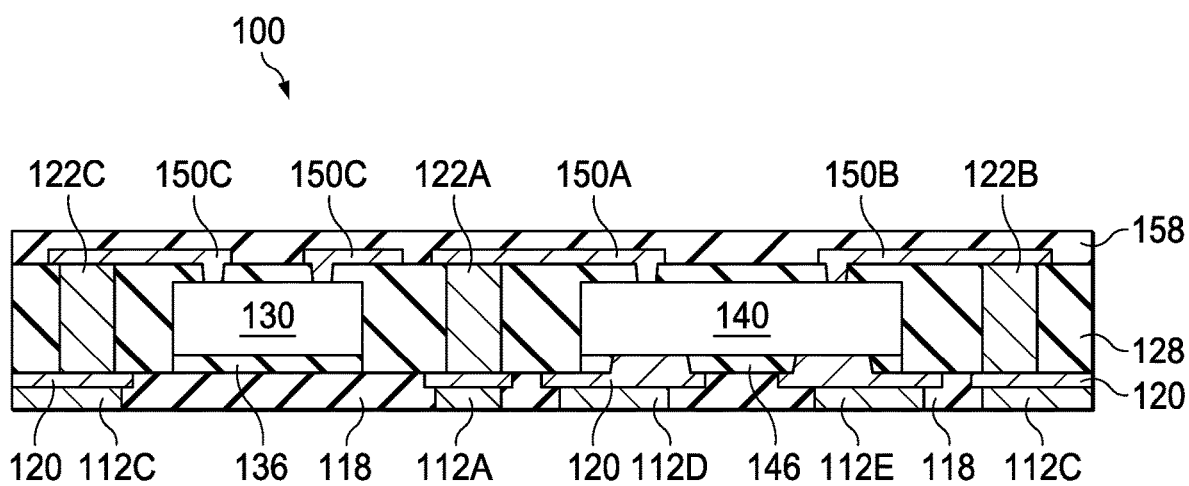

As represented by FIG. 2H, an additional metal layer, such as a solderable metal and/or corrosion-resistant metal is plated over metal trace 120 to form electrical contact pads 112 (FIG. 3, step 218). As further represented by FIG. 2H, the partially assembled device is molded, thereby covering metal trace 120 with a dielectric substrate layer 158, while leaving electrical contact pads 112 exposed on an outer surface of semiconductor package 100 (FIG. 3, step 220).

In some alternative examples, step 212 may be formed in conjunction with or after step 220 such that metal trace 150 remains exposed during patterning of metal trace 120. In the same or different examples, metal trace 120 may be patterned before patterning metal trace 150.

In some examples, semiconductor package 100 may be one of an array of packages manufactured on a common carrier 10 using common molds for one or more of dielectric substrate layers 118, 128, 158. In such examples, the method further includes singulating the array of molded packages to form individual semiconductor packages 100. Singulation may include cutting through any dielectric material linking the interconnected packages with a saw or other cutting implement.

Figure 4:
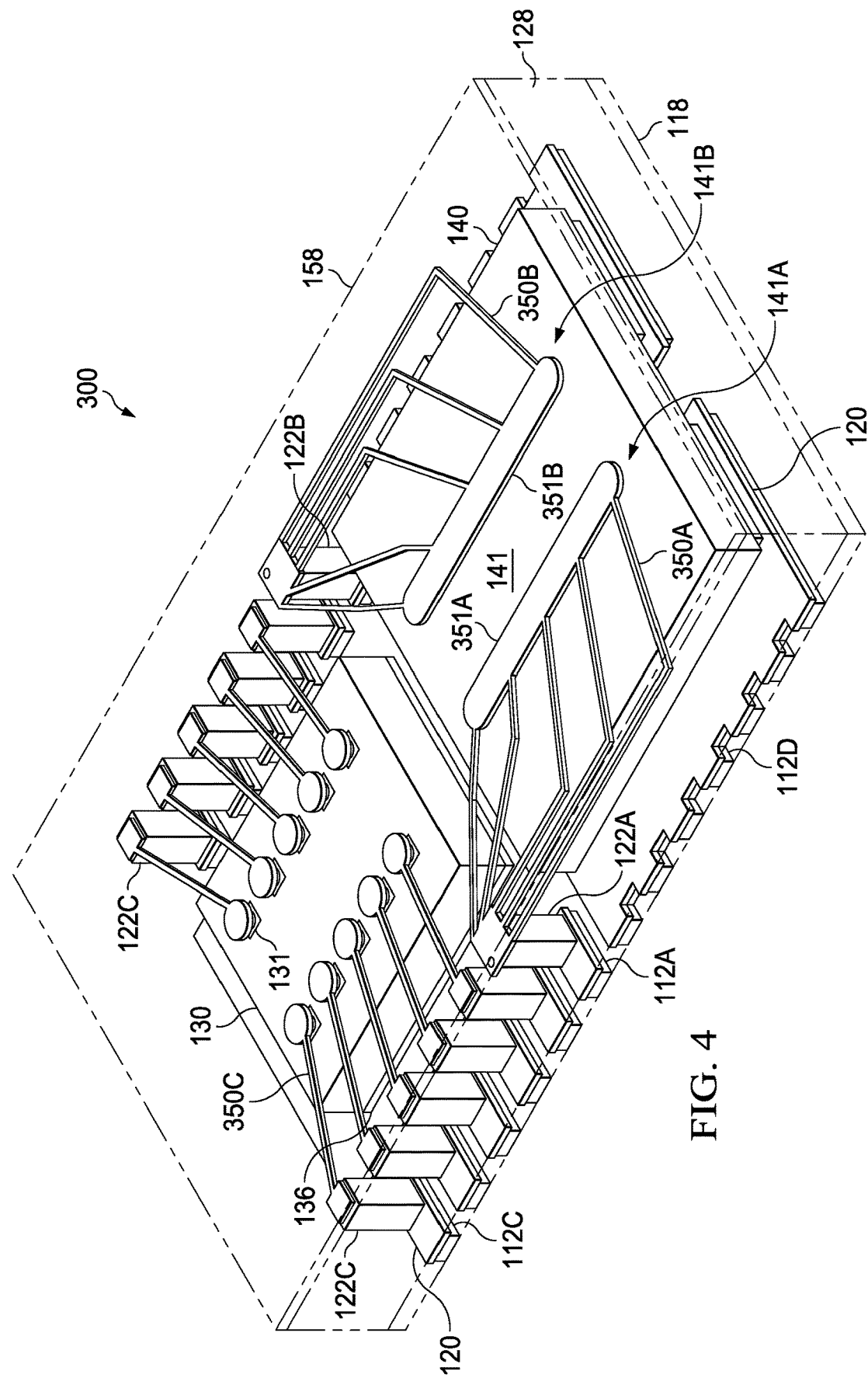
FIG. 4 illustrates an alternative multilayer package design including an embedded semiconductor die and shunt, wherein the metal trace connects to the shunt with trenches rather than vias.

FIG. 4 illustrates semiconductor package 300. Semiconductor package 300 is substantially similar to semiconductor package 100 except that metal trace 150 has been replaced by metal trace sections 350A-350C, representing a first metal trace 350. Metal trace 350 is substantially similar to metal trace 150 except that metal trace sections 350A, 350B includes trenches 351A, 351B rather than vias 151A, 151B of metal trace sections 150A, 150B. Metal trace section 350C is substantially similar to metal trace section 150C. Metal trace section 350A fills a trench 351A that electrically connects a first portion 141A of surface 141 of shunt 140 to metal pillar 122A, and metal trace section 350B fills a trench 351B that electrically connects a second portion 141B of surface 141 to a second metal pillar 122B. Trenches 351A, 351B represent elongated vias. Trenches 351A, 351B may be formed by repeated laser drilling through dielectric substrate layer 128 to expose elongated cavities adjacent portions 141A, 141B of surface 141 in dielectric substrate layer 128 before plating metal trace 350 over dielectric substrate layer 128, filling the elongated cavities with the metal of metal trace 350.

Use of trenches 351A, 351B rather than vias 151A, 151B increases the contact area between metal trace sections 350A, 350B and shunt 140. In some examples, trenches 351A, 351B may each extend at least half of a width of surface 141. Such a design may improve sensing accuracy in the event of a defect or crack between elements of the load current path through package 300. For this reason, package 300 may provide further resilience and redundancy for current sensing a load current through shunt 140 as compared to package 100.

Elements of semiconductor package 300 with the same numbers as semiconductor package 100 are the same or substantially similar to those elements in semiconductor package 100. For brevity, such elements are described in limited or no detail with respect to semiconductor package 300.

Like semiconductor package 100, semiconductor package 300 includes a first layer including semiconductor die 130 and shunt 140 embedded in a dielectric substrate layer 128, and a second layer stacked on first layer. The second layer includes metal trace 350, patterned on first dielectric substrate layer 128, and a second dielectric substrate layer 158 over first metal trace 350.

Semiconductor package 300 also includes a base layer with metal trace 120 patterned on first dielectric substrate layer 128 opposite first metal trace 350 relative to semiconductor die 130 and shunt 140, and a third dielectric substrate layer 118 over second metal trace 120. Second metal trace 120 electrically connects electrical contact pads 112 to shunt 140, metal pillars 122, and semiconductor die 130. Electrical contact pads 112 provide electrical connections to shunt 140 and semiconductor die 130 via metal traces 120, 350 and metal pillars 122.

In this manner, metal pillars 122 and metal traces 120, 350 provide routable three-dimensional electrical connections between semiconductor die 130, shunt 140 and electrical contact pads 112 of semiconductor package 300.

Figure 5A:
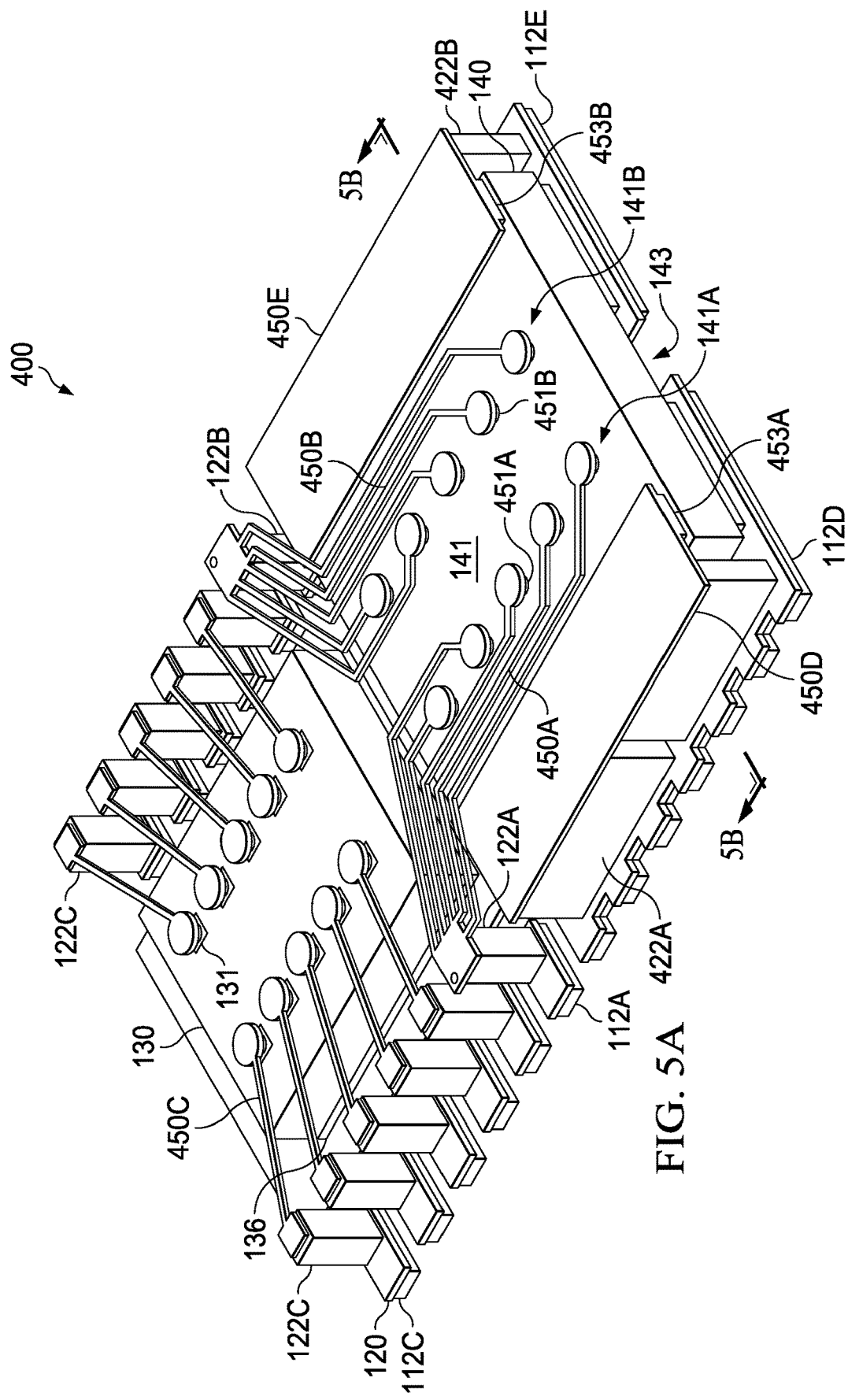
FIGS. 5A and 5B illustrate an alternative multilayer package design including an embedded semiconductor die and shunt, wherein the metal trace includes topside connections for load currents through the shunt.
Figure 5B:
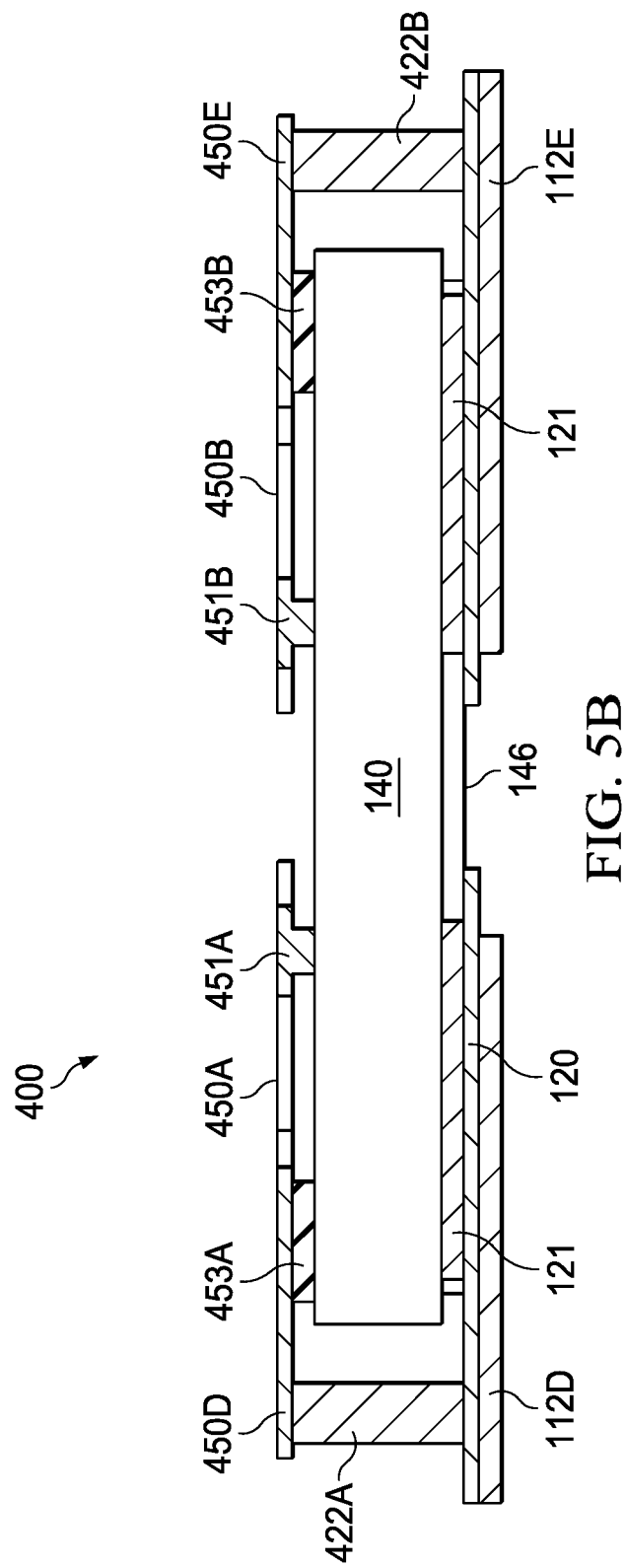

FIG. 5A shows an exploded perspective view of semiconductor package 400, and FIG. 5B illustrates a cross-sectional view of package 400. Semiconductor package 400 is substantially similar to semiconductor package 100 with the addition of metal pillars 422A, 422B, to provide a redundant current path for load current through shunt 140. In addition, metal trace 150 is replaced by metal trace sections 450A-450E, representing a metal trace 450. Metal trace 450 is substantially similar to metal trace 150 with the addition of metal trace sections 450D, 450E. Metal trace sections 450A-450C are substantially similar to metal trace sections 150A-150C.

Metal trace sections 450D, 450E include trenches 453A, 453B in contact with portions of surface 141 of shunt 140 outside the contact areas for vias 451A, 451B. Metal pillars 422 extend between of metal trace sections 450D, 450E in direct contact with surface 141 of shunt 140 and portions of second metal trace 120 in direct contact with a second surface 143 of shunt 140.

As best shown in FIG. 5B, metal pillars 422A, 422B and metal trace sections 450D, 450E provide a redundant load current path from electrical contact pads 112D, 112E through shunt 140. As described with respect to package 100, vias 121 of metal trace 120 provide the primary load current path from electrical contact pads 112D, 112E through shunt 140. The redundant load current path of package 400 may improve sensing accuracy in the event of a defect or crack between elements of the primary load current path, including the connections between shunt 140 and vias 121 of metal trace 120. For this reason, package 400 may provide further resilience and redundancy for current sensing a load current through shunt 140 as compared to package 100.

In alternative examples, vias 451A, 451B of package 400 may be replaced with trenches 351A, 351B as described with respect to package 300 to provide further resilience and redundancy for current sensing a load current through shunt 140.

Elements of semiconductor package 400 with the same numbers as semiconductor package 100 are the same or substantially similar to those elements in semiconductor package 100. For brevity, such elements are described in limited or no detail with respect to semiconductor package 400.

Like semiconductor package 100, semiconductor package 400 includes a first layer including semiconductor die 130 and shunt 140 embedded in a dielectric substrate layer 128, and a second layer stacked on first layer. The second layer includes metal trace 450, patterned on first dielectric substrate layer 128, and a second dielectric substrate layer 158 over first metal trace 450.

Semiconductor package 400 also includes a base layer with metal trace 120 patterned on first dielectric substrate layer 128 opposite first metal trace 450 relative to semiconductor die 130 and shunt 140, and a third dielectric substrate layer 118 over second metal trace 120. Second metal trace 120 electrically connects electrical contact pads 112 to shunt 140, metal pillars 122, 422, and semiconductor die 130. Base layer 102 also forms exposed electrical contact pads 112. Electrical contact pads 112 provide electrical connections to shunt 140 and semiconductor die 130 via metal traces 120, 450 and metal pillars 122, 422.

In this manner, metal pillars 122, 422 and metal traces 120, 450 provide routable three-dimensional electrical connections between semiconductor die 130, shunt 140 and electrical contact pads 112 of semiconductor package 400.

The specific techniques for multilayer packages with an embedded semiconductor die and shunt with a patterned metal trace, including techniques described with respect to packages 100, 300, 400, are merely illustrative of the general inventive concepts included in this disclosure as defined by the following claims.

What is claimed is:

1. A method of forming a semiconductor package comprising:
grinding a first dielectric substrate layer that covers a semiconductor die, a shunt, and metal pillars to expose distal ends of the metal pillars adjacent a surface of the first dielectric substrate layer;
forming vias in the first dielectric substrate layer to expose a first portion and a second portion of the shunt, wherein a metal trace fills the vias and covers the first dielectric substrate layer;
patterning the metal trace over the first dielectric substrate layer to electrically connect the first portion of the shunt to a first metal pillar of the metal pillars, and to electrically connect the second portion of the shunt to a second metal pillar of the metal pillars;
applying a second dielectric substrate layer over the metal trace and the first dielectric substrate layer; and
forming a base layer on the first dielectric substrate layer opposite the second dielectric substrate layer, the base layer including exposed electrical contact pads for the semiconductor package, the electrical contact pads providing electrical connections to the shunt, the metal pillars, and the semiconductor die.

2. The method of claim 1, wherein applying the second dielectric substrate layer comprises using the second dielectric substrate layer to cover the semiconductor die, the shunt, and the metal pillars.

3. The method of claim 1, further comprising:
mounting the semiconductor die and the shunt to a carrier; and
plating the metal pillars on the carrier.

4. The method of claim 3, further comprising, after patterning the metal trace, removing a subassembly including the semiconductor die, the shunt, the metal pillars, the first dielectric substrate layer, and the metal trace from the carrier.

5. The method of claim 3, further comprising using the first dielectric substrate layer to mold the semiconductor die, the shunt, and the metal pillars to cover the semiconductor die, the shunt, and the metal pillars.

6. The method of claim 3, wherein mounting the semiconductor die and the shunt to the carrier comprises using an adhesive layer to mount the semiconductor die and the shunt to the carrier.

7. The method of claim 6, wherein the adhesive layer comprises thermal adhesives or UV sensitive adhesives.

8. The method of claim 3, wherein the carrier comprises metal or glass.

9. The method of claim 1, wherein forming the vias in the first dielectric substrate layer comprises laser drilling the vias.

10. The method of claim 1,
wherein the vias form a first trench and a second trench adjacent the shunt;
wherein the metal trace electrically connects the shunt to the first metal pillar via the first trench, and
wherein the metal trace electrically connects the shunt to the second metal pillar via the second trench.

11. The method of claim 1,
wherein the vias are a first set of vias, and
wherein the semiconductor die includes bond pads providing electrical connections to functional circuitry of the semiconductor die,
the method further comprising forming a second set of vias in the first dielectric substrate layer over the bond pads, wherein the metal trace fills the second set of vias, electrically connecting the functional circuitry to the metal trace.

12. The method of claim 1, wherein the metal trace is a first metal trace, the method further comprising patterning a second metal trace on the first dielectric substrate layer opposite the first metal trace, the second metal trace providing electrical connections between the metal pillars and the electrical contact pads.

13. The method of claim 12, further comprising using a third dielectric substrate layer to mold the second metal trace, leaving the electrical contact pads exposed on an outer surface of the semiconductor package to form the base layer.

14. The method of claim 12, further comprising plating a metal layer over the second metal trace to form the electrical contact pads over the second metal trace.

15. The method of claim 1, wherein forming the vias in the first dielectric substrate layer comprises chemically etching the vias.

16. The method of claim 1, wherein the electrical contact pads comprise solderable metal or corrosion resistant metal.

* * * * *